United States Patent [19]

Poulsen et al.

[11] Patent Number: 4,528,438

[45] Date of Patent: Jul. 9, 1985

[54] END POINT CONTROL IN PLASMA ETCHING

[75] Inventors: Robert G. Poulsen; Gerald M. Smith; William D. Westwood, all of Ottawa, Canada

[73] Assignee: Northern Telecom Limited, Montreal, Canada

[21] Appl. No.: 456,506

[22] Filed: Jan. 7, 1983

Related U.S. Application Data

[63] Continuation of Ser. No. 724,015, Sep. 16, 1976, abandoned.

[51] Int. Cl.³ .................. B23K 9/00; C23C 15/00
[52] U.S. Cl. .................. 219/121 PE; 219/121 PG; 156/646; 156/345; 204/192 E
[58] Field of Search ............ 219/121 PD, 121 PG, 219/121 PE, 121 PF; 204/192 E, 192 EC, 164; 156/345, 643, 646

[56] References Cited

U.S. PATENT DOCUMENTS

| 3,664,942 | 5/1972 | Havas et al. | 204/192 E |
| 3,809,479 | 5/1974 | Whelan et al. | 156/643 |
| 3,966,577 | 6/1976 | Hochberg | 156/643 |
| 4,028,155 | 6/1977 | Jacob | 156/643 |
| 4,491,499 | 1/1985 | Jerde et al. | 156/626 |

FOREIGN PATENT DOCUMENTS 51-35639  3/1976  Japan .

Primary Examiner—M. H. Paschall
Attorney, Agent, or Firm—Schwartz, Jeffery, Schwaab, Mack, Blumenthal & Evans

[57] ABSTRACT

The end point in plasma etching is detected by monitoring the optical emission from the plasma, selecting a particular optical emission line and detecting a substantial variation in the intensity of the emission. This indicates a change in material being etched and thus the completion of etching of one material, or the beginning of etching of another material. It is also applicable to removing, or etching, photoresist material.

16 Claims, 6 Drawing Figures

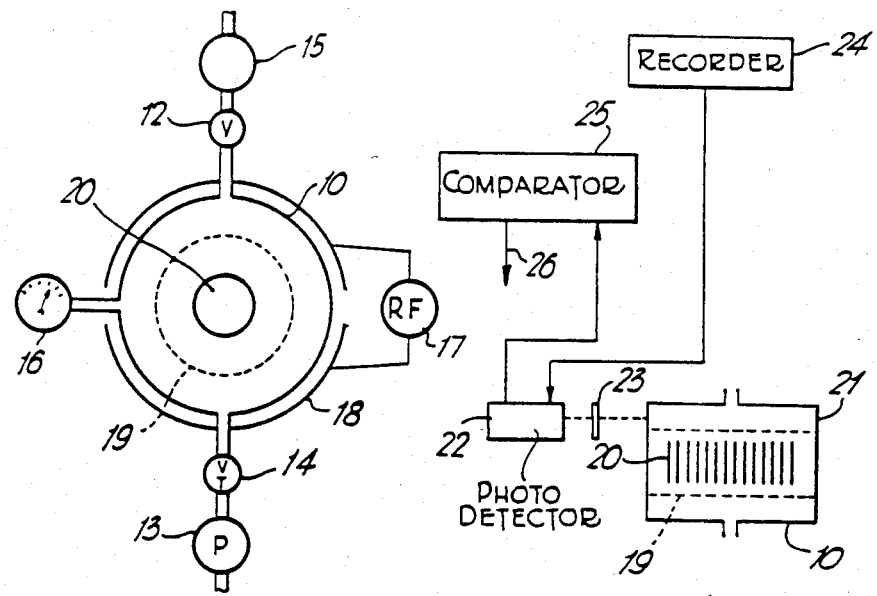
Fig-1-   Fig-2-
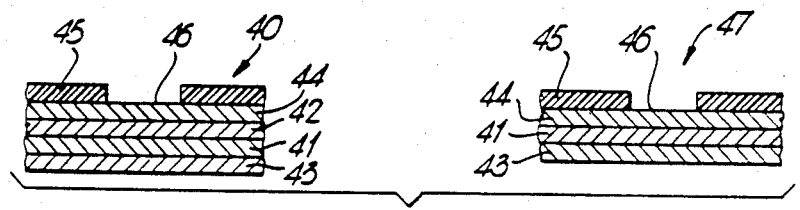
Fig-4a-
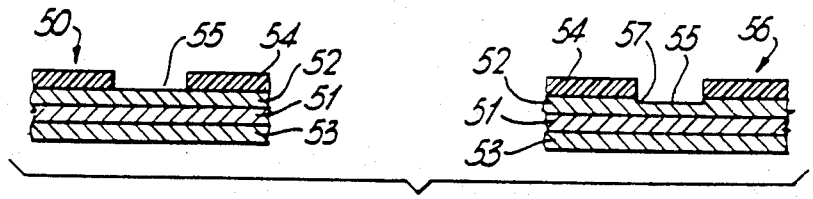
Fig-4b-

END POINT CONTROL IN PLASMA ETCHING

This is a continuation of application Ser. No. 724,015, filed Sept. 16, 1976, now abandoned.

This invention relates to end point control in plasma etching and particularly to end point control by the detection of a substantial variation in the intensity of an optical emission line from the plasma.

In plasma etching, for various reasons, such as variations in starting temperature, plasma conditions and etching area, there is normally considerable variation in etching from run to run. It is therefore difficult to ensure that etching is terminated at the correct time (ie. end point) for optimal etching, ie, when the layer to be etched is removed but patterns in the layer are not overetched and the underlying layer is not significantly etched into.

The present invention provides for accurate end point control by detection of a change in an emission line when the underlying layer has been reached, with a change in material at that level.

The invention will be readily understood by the following description of typical apparatus and some examples of materials and emission lines, by way of example, in conjunction with the accompanying drawings, in which:

FIG. 1 is a diagrammatic illustration of a plasma reaction chamber with associated apparatus;

FIG. 2 is a diagrammatic illustration of reaction chamber and emission detector;

FIGS. 4A and 4B illustrate the use of dummy wafers for end point detection of particular materials;

Figure 5:
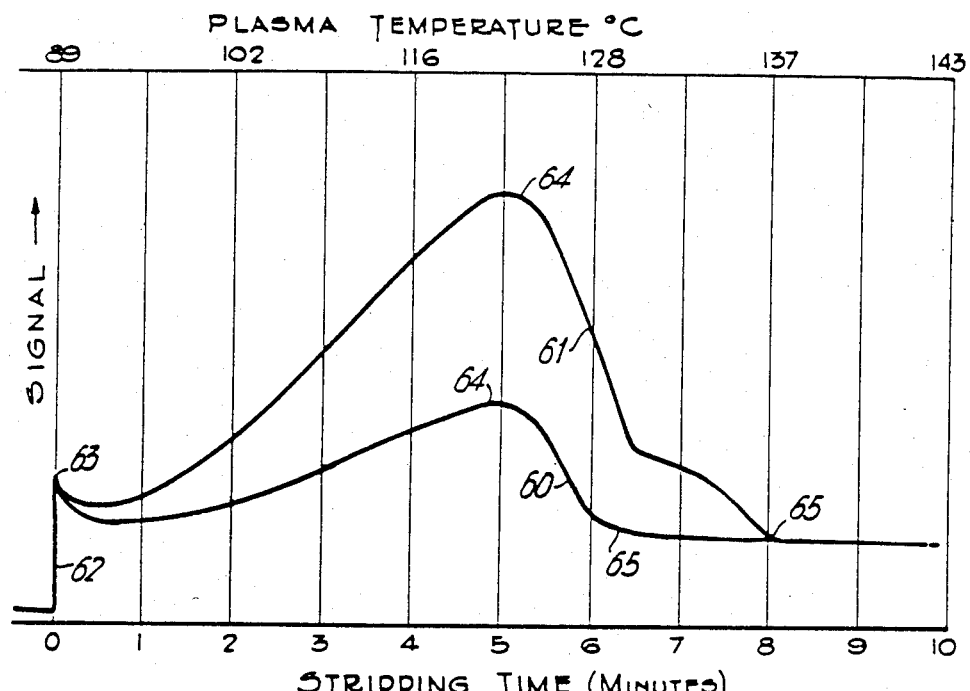
FIG. 5 illustrates emission signals for photoresist stripping.

A typical plasma etching apparatus is illustrated in FIG. 1, where the reaction chamber is seen in cross-section normal to its axis. A suitable etchgas, typically $CF_4+5\%O_2$, or just $O_2$ for plasma stripping of photoresist is introduced into the cylindrical quartz reaction chamber 10 through a needle valve 12 and maintained at pressure P by the vacuum pump 13 which evacuates the reaction chamber 10 through the throttle valve 14. The etchgas flowrate is set by adjustment of the needle valve 12 and monitored accurately with the mass flow meter 15; the pressure is set independently with the throttle valve 14 and monitored with a precision pressure gauge 16. Flowrates of 5 to 500 cc/min. and pressures of 0.25 to 1.5 Torr are typical. A plasma is generated in the reactor by applying power from the RF power supply 17 to the capacitor plates 18 located round the reaction chamber 10; power levels of 10 to 500 watts being typical. An impedance matching network in the RF power supply 17 is used to optimize power coupling into the plasma. Etchrates are made more uniform and controlled by use of a perforated metal RF shield 19 which serves to confine the plasma to the annular region outside it thereby reducing the temperature and temperature nonuniformity at the workpieces 20 which are generally loaded in quartz holders.

In a typical etching process, the workpieces are loaded in the reaction chamber, the chamber is evacuated, the etchgas is introduced, and etching begins when the RF power is switched on. The reactor temperature rises during etching and, because the etchrate is very temperature dependent, the thickness etched in a specified time depends sensitively on the thermal characteristics of the reactor and workpieces (i.e., starting temperature, thermal mass, and thermal time constant). For material like Si, poly Si, and $Si_3N_4$ and Ti the etchrates are high and depend also on the area of the workpieces exposed to the etchgas, the separation between adjacent workpieces and on workpieces position and number. The latter dependence occurs because there is competition amongst the workpieces for available etchant species; and accordingly the etchrate decreases with increasing number of workpieces. Also workpieces in the centre of a batch etch more slowly than the end wafers due to the depletion effects.

As a result of the dependences on temperature, plasma conditions, and work load, the times required for the same etching application generally vary considerably from run to run thus making it necessary to monitor the progress of etching so that the etchcycle can be properly terminated. Irreparable damage is done to the workpieces if they are overetched, so that end point monitoring or control methods are important and must be precise. For example, in the fabrication of semiconductor devices, plasma etching is generally applied to the photoresist masked etching of patterns in thin layers on slowly etching substrates. The substrate then serves as a partial etchstop and the effect of overetching is to cause undesirable etching under the mask edges (undercutting) and excessive etching into the substrate layer. In some cases the substrate layer is a thin layer over a fast etching layer and penetration of the etching into this lower layer can cause irreparable damage.

While it is possible to monitor etching by visual observation, this is often difficult. Reliance is placed on there being some visual change—such as a change in colour of the surface being etched. This is not always available and depends to a large extent on the perceptual accuity of the operator. Also, constant observation by the operator is necessary.

The present invention monitors the optical emission from the plasma. It is possible to select emission lines that are sensitive to changes in the material being etched, thereby indicating the onset of etching into an underlying layer at the endpoint. One form of apparatus for monitoring the plasma emission is illustrated in FIG. 2.

The optical emission from the plasma at 21 (in the reaction chamber 10) is viewed by the photodetector 22 through the filter 23, the passband of which is chosen to select an emission line the intensity of which is particularly sensitive to changes in the material being etched. The photodetector signal is continuously monitored on a strip chart recorder 24, and can also be input to a comparator circuit 25 which triggers shut down of the etchcycle via an output through connection 26 to the RF power supply 17. A photomultiplier tube with an electrometer output amplifier can be used as the detector but solid state detectors are preferable as they are more compact and less expensive.

Experiments using a monochromator showed that a line at about 0.70 $\mu$m wavelength changed significantly when the wafer was changed from $SiO_2$ to Si for etching in $CF_4+O_2$. The signal amplitude for this emission line was unchanged when the $SiO_2$ wafer was removed or when many $SiO_2$ or $Si_3N_4$ wafers were inserted. Addition of Si wafers caused large decreases in the intensity of this emission line, the fractional decreases being greatest for large wafer loads, high RF power, and low $CF_4+5\%O_2$ etchgas pressure. The $Si/SiO_2$ signal ratio decreased slightly with increasing temperature, and all signals decreased sharply with addition of $N_2$ to the etchgas. The decrease in the 0.70 μm emission line intensity with increased etchrate or waferload suggests that the intensity of this line may depend on the number of available Si etching radicals in the plasma which is depleted as the etchrate or load is increased. Alternatively, this emission line may be positioned by the Si etching reaction products.

Figure 3:
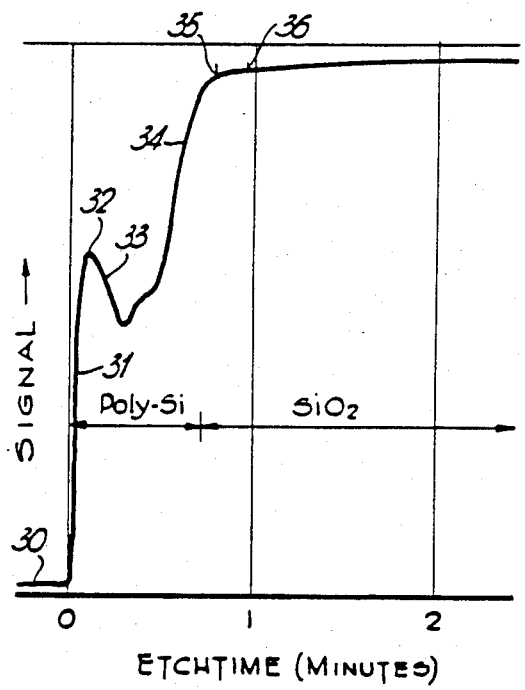
FIG. 3 is a typical emission signal for one etchant gas for a particular type of wafer.

An example of the endpoint monitor signal achieved in a typical polysilicon etching run is shown in FIG. 3. The original trace had better than 30:1 signal to noise ratio, and the signal change of 40% was achieved for the etching of a single photoresist patterned wafer of Poly-Si over $SiO_2$ at 50 watts in 0.25 Torr $CF_4+5\%O_2$ etchgas at 50° C. The signal level at 30 is due to background illumination. The signal increases at 31, when the plasma is ignited and reaches a level at 33 characteristic of the Si etching. The signal then increases again, at 34, as parts of the $SiO_2$ substrate are exposed, and finally the endpoint of the etching is marked by abrupt levelling off of the time dependence of the signal at 35. Similar curves for successive runs are found to be very reproducible in form and amplitude. Also similar curves are observed for larger wafer batches; the relative change in signal at the endpoint being much greater, and the abrupt change in slope at the endpoint being smeared out slightly due to nonuniformity in poly thickness and etchrate across the batch. The etchrate decreases with increasing wafer load and this can be compensated for by an increase in power with a corresponding increase in the signal amplitudes from the endpoint monitor. The peak 32 at the onset of silicon etching generally occurs only when etching is preceded by a short $O_2$ plasma treatment used to improve etching uniformity by removal of photoresist scum; the peak being attributed to the etching of the thin $SiO_2$ layer formed during the plasma oxidation pre-clean.

Points 35 and 36 in FIG. 3 correspond to the termination points for two patterned wafers etched using the method of endpoint control of the present invention. The wafer on which etching was terminated at 35 was clear of Poly-Si in all exposed areas with negligible undercut. The wafer terminated at 36 showed sufficiently little undercut to allow the etching of good 2 μm features. This shows that the endpoint is easily recognized with a window, during which etching should be terminated, that is wide enough to accommodate typical variations in poly-silicon thickness or etchrate nonuniformity within a batch load.

The 0.70 emission line may also be used for monitoring of the plasma patterning of other structures, for example $Si_3N_4$ on $SiO_2$ on Si, typically used in silicon integrated circuit manufacture. This is accomplished by using a dummy wafer, as illustrated in FIGS. 4(a) and 4(b), FIG. 4(a) relating to $Si_3N_4$ on $SiO_2$ and FIG. 4(b) relating to $SiO_2$ on Si.

In FIG. 4(a), a wafer 40 comprises a silicon substrate 41 on which is a layer of $SiO_2$ 42 on one surface and a back protection layer 43 on the other surface. A layer of $Si_3N_4$ 44 is formed on the $SiO_2$ layer 42 and a masking layer 45 is formed on the layer 44, defining an area 46 which is to be etched. Provided with wafer 40 is a dummy wafer 47. Wafer 47 has the silicon substrate 41, and back protection layer 43 but the $SiO_2$ layer 42 is omitted, the $Si_3N_4$ layer 44 being directly on the substrate. The masking layer 45 is formed on layer 44, with the area 46 defined. The $Si_3N_4$ layers 44 on each wafer is the same thickness. One or more wafers 40 are loaded into the reaction chamber with a dummy wafer 47. Etching is terminated just after the optical emission intensity decrease associated with penetration of etching through the $Si_3N_4$ layer 44 into the silicon substrate 41 of the dummy wafer 40 occurs.

A similar approach is used for $SiO_2$ over Si. As illustrated in FIG. 4(b) a wafer 50 has a silicon substrate 51 having a $SiO_2$ layer 52 on one surface and a back protection layer 53 on the other surface. A masking layer 54 is formed on the $SiO_2$ layer 52, defining an area 55 to be etched. A dummy wafer 56 is also provided having the same formation as wafer 50 that is silicon substrate 51, $SiO_2$ layer 52, back protection layer 53 and masking layer 54 defining area 55. The layers 52 are of the same thickness but in this example the $SiO_2$ layer 52 of the dummy wafer 56 is given a slight pre etch—for example =500−1000 Å—prior to use as indicated at 57. The wafer, or wafers, 50 are loaded into the reaction chamber with a dummy wafer 56. Etching is terminated when the Si etching emission signal level, associated with the dummy wafer, is detected. Then a thin layer of $SiO_2$ remains over the substrate 51 of the wafer, or wafers, 50 and the etching to the $Si/SiO_2$ interface can be completed with a chemical dip etch that does not degrade pattern resolution, if required. Silicon plasma etches so much more quickly than $SiO_2$ that the plasma etching cannot be terminated at the $Si/SiO_2$ interface with $CF_4+5\%O_2$ etchgas without unacceptable damage to areas of the underlying silicon due to nonuniformity of etching and of layer thickness.

To provide for nonuniformities of etch rate and of layer thicknesses when using dummy wafers, $Si_3N_4$ etching should continue slightly past the endpoint signal, and the $SiO_2$ etchback of $SiO_2$ over Si dummy wafer must be larger than the nonuniformities. For both examples, the dummy wafers must have the same layer and masking characteristics as the batch wafers and the wafers should be equally spaced in the reactor. The back protection layers 43 and 53 are provided to avoid spurious Si signals from the backs of the wafers.

Some major advantages of the new endpoint monitor for marking the onset (or completion) of silicon layer etching, include:

(1) The endpoint indicator is clear and precise thereby requiring a minimum of operator judgement or skill. Moveover the signal is reproducible and changes rapidly near the endpoint thereby being suitable for use with a comparator circuit set at say 80% of the $SiO_2$ signal to trigger a time delayed termination of the etchcycle. The setpoint can easily be calibrated with a dummy load.

(2) The method automatically compensates for changes in wafer number, spacing, area exposed and layer thickness from batch to batch.

(3) The method also automatically compensates for batch to batch variations in starting temperature, and plasma conditions. Thus, it allows a relaxation in the required accuracy of setting of all the plasma parameters.

(4) A consequence of (3) is that the need for temperature control and preheating is eliminated, and short, low temperature, high RF power etchcycles with faster throughput become feasible, without compromising endpoint control accuracy. By allowing fast etching at low temperature and high RF power, the invention permits maintenance of good etchrate uniformity with minimal photoresist erosion. This enables finer line patterning over a more highly stepped layer than is normally possible.

Optical emission endpoint control also has application in photoresist stripping, as illustrated in FIG. 5. In FIG. 5, curve 60 corresponds to one 3" diameter wafer while curve 61 corresponds to four 3" diameter wafers. The coordinates of the curves are intensity of the emission line and stripping time respectively. The stripping time is also related to plasma temperature, as shown. The particular curves 60 and 61 are for an emission line at a wavelength of about 0.30 μm for stripping of photoresist in an 0.5 Torr $O_2$ plasma at an RF power of 300 watts inside an etch tunnel. After an initial rise at 62 the signal peaks slightly at 63, decreases, and then increases with increasing temperature and stripping time to a maximum at 64 when parts of the photoresist area are stripped away. The signal then decreases until all the photoresist is stripped away at 65, and then levels off. The endpoint is clearly visible even for partial loads. The signal amplitude increases with increasing photoresist area, reactor temperature and RF power, but decreases with increasing $O_2$ pressure. The emission line increases with increasing stripping, suggesting that it is associated with a reaction product.

The emission line at about 0.30 μm is particularly sensitive to photoresist stripping. However there are groups of lines between about 0.250 and about 0.340 μm and between about 0.450 and about 0.485 μm, and a single line at about 0.650 μm that have similar sensitivity.

The emission occurs from a species present in the plasma, which species is associated with a change in material being etched. Thus a signal produced by a change in intensity of the emission can be used to indicate either the end point of etching of a particular material, or of the end point of etching some other material over a particular material—that is indicate the beginning of etching of that particular material.

While the emission line at about 0.70 μm wavelength has been found to be particularly effective in the plasma etching of Si on $SiO_2$, or vice versa, it is appreciated that with other materials other lines can prove effective.

Similarly, while $CF_4+5\%O_2$ has been described as the etchgas in etching Si, the oxygen content can be varied from zero as is well known, and $CF_4+5\%O_2$ has been chosen as a convenient etchgas.

In FIGS. 1 and 2, what is known as a volume loading apparatus is described. The invention can also be used with a surface loading form of apparatus.

The process is suitable for the photoresists commonly used in integrated circuit fabrication. For example, typical photoresists are the Waycoat HR series supplied by Philip A. Hunt Co. (Canada) Ltd., and the Shipley 1350 series supplied by the Shipley Company Incorporated.

A key feature is the selection of the most useful emission lines for greatest sensitivity. There can be various emission lines showing useful characteristics and the method of selection and detection can be varied.

What is claimed is:

1. A process for the uniform application of a pattern to a plurality of workpieces by selective etching, comprising the steps of:
    (a) exposing a plurality of workpieces in a reaction space to a chemically reactive plasma which etches the exposed surface of each workpiece by chemically reacting with the material from which said surface is comprised;
    (b) monitoring the variation over time of the amplitude of at least one atomic emission line of the atomic emission spectrum of said plasma during the reaction of said plasma with said workpieces, said emission line having an amplitude which is sensitive to the concentration in said plasma of a member selected from a product of said reaction or an etching radical; and
    (c) determining the end point of said selective etching by a change in said amplitude.

2. A process as in claim 1, wherein said emission line has an amplitude which is sensitive to the concentration in said plasma of a product of said reaction.

3. A process as in claim 1, further comprising the step (d), following step (c), of terminating said selective etching at a predetermined time after said end point determination.

4. A process as in claim 2, wherein at least a first one of said workpieces comprises a substrate comprised of a first material and a layer of a second material applied directly to said substrate, which layer comprised of said second material is exposed to said plasma, said atomic emission line having an amplitude during etching of said first material in said plasma which substantially differs from the amplitude for etching said second material in said plasma.

5. A process as in claim 4, wherein at least one of the remaining workpieces comprises an outer layer comprised of said second material having a thickness substantially equal to the layer of said second material in said first workpiece, and a layer of a third material adjacent to said second layer, said atomic emission line having an amplitude during etching of said third material in said plasma which does not substantially differ from the amplitude for said second material in said plasma, and wherein the end point for all of said workpieces is determined by a change in the amplitude of said atomic emission line for etching said first and second materials.

6. A process as in claim 5, wherein said second material consists essentially of $Si_3N_4$ and said third material consists essentially of $SiO_2$.

7. A process as in claim 4, wherein said layer of second material in said first workpiece is slightly thinner than the layer of said second material in said remaining workpieces.

8. A process as in claim 4, further comprising the step of subjecting said layer of second material in said first workpiece to a slight pre-etch before said step (a).

9. A process as in claim 7, further comprising the steps following step (c) of terminating said selective etching at said determined end point, and thereafter subjecting said at least one remaining workpiece to a wet chemical etching treatment, which does not degrade resolution of said pattern, to complete removal of said layer of second material.

10. A process as in claim 1, wherein said emission line has an amplitude which is sensitive to the concentration in said plasma of an etching radical.

11. A method for providing end point control in a plasma etching process for removing a material from a workpiece, comprising the steps of:
    (a) selectively removing material from a workpiece by chemical reaction between etching radicals in a plasma and the material being removed;
    (b) monitoring an atomic emission line having an amplitude which is sensitive to the concentration in said plasma of a product of said reaction;

(c) determining the end point of said plasma etching process by a change in said amplitude; and (d) terminating said chemical reaction at a predetermined time after said detected end point.

12. A process as in claim 1, where at least one of said workpieces is exposed to said plasma through a photoresist.

13. A process as in claim 2, wherein said second material consists essentially of silicon and said first material consists essentially of $SiO_2$.

14. A process as in claim 1, wherein said chemically reactive plasma comprises $CF_4$.

15. A process as in claim 1, wherein said atomic emission line is at about 0.70 m wavelength.

16. A process as in claim 4, wherein each of the remainder of said workpieces comprises a substrate comprised of a first material and a layer comprised of a second material applied directly to said substrate, which layer comprised of said second material is exposed to said plasma, said atomic emission line having an amplitude during etching of said first material in said plasma which substantially differs from the amplitude for etching said second material in said plasma, whereby said plurality of workpieces does not comprise a dummy wafer.

* * * * *